(12) United States Patent
Davis et al.

(10) Patent No.: US 8,334,190 B2
(45) Date of Patent: Dec. 18, 2012

(54) SINGLE STEP CMP FOR POLISHING THREE OR MORE LAYER FILM STACKS

(75) Inventors: Eugene C. Davis, McKinney, TX (US); Binghua Hu, Plano, TX (US); Sopa Chevacharoenkul, Richardson, TX (US); Prakash D. Dev, Lubbock, TX (US)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 12/776,057

(22) Filed: May 7, 2010

(65) Prior Publication Data

US 2011/0275168 A1 Nov. 10, 2011

(51) Int. Cl.
*H01L 21/763* (2006.01)
*H01L 21/302* (2006.01)

(52) U.S. Cl. ........... 438/430; 438/8; 438/693; 438/702; 257/E21.23; 257/E21.304; 257/E21.572

(58) Field of Classification Search .................. 438/637, 438/633, 692, 700, 8, 430, 693, 702; 257/E21.23, 257/E21.304, E21.572
See application file for complete search history.

(56) References Cited

U.S. PATENT DOCUMENTS

| | | | | |
|---|---|---|---|---|
| 4,666,556 A | * | 5/1987 | Fulton et al. | 438/431 |
| 6,191,039 B1 | | 2/2001 | Chang et al. | |
| 6,251,734 B1 | * | 6/2001 | Grivna et al. | 438/430 |
| 6,350,693 B2 | | 2/2002 | Chang et al. | |
| 7,531,415 B2 | | 5/2009 | Kwok | |
| 2005/0170661 A1 | * | 8/2005 | Economikos et al. | 438/759 |

FOREIGN PATENT DOCUMENTS

KR 2001038607 * 5/2001

* cited by examiner

*Primary Examiner* — Mary Wilczewski
*Assistant Examiner* — Toniae Thomas
(74) *Attorney, Agent, or Firm* — Frederick J. Telecky, Jr.; Wade J. Brady, III; Jacqueline J Garner

(57) ABSTRACT

A one-step CMP process for polishing three or more layer film stacks on a wafer having a multilayer film stack thereon including a silicon nitride (SiNx) layer on its semiconductor surface, and a silicon oxide layer on the SiNx layer, wherein trench access vias extend through the silicon oxide layer and SiNx layer to trenches formed into the semiconductor surface, and wherein a polysilicon layer fills the trench access vias, fills the trenches, and is on the silicon oxide layer. CMP polishes the multilayer film stack with a slurry including slurry particles including at least one of silica and ceria. The CMP provides a removal rate (RR) for the polysilicon layer > a RR for the silicon oxide layer > a RR for the SiNx layer. The CMP process is continued to remove the polysilicon layer, silicon oxide layer and a portion of the SiNx layer to stop on the SiNx layer. Optical endpointing during CMP can provide a predetermined remaining thickness range for the SiNx layer.

16 Claims, 2 Drawing Sheets

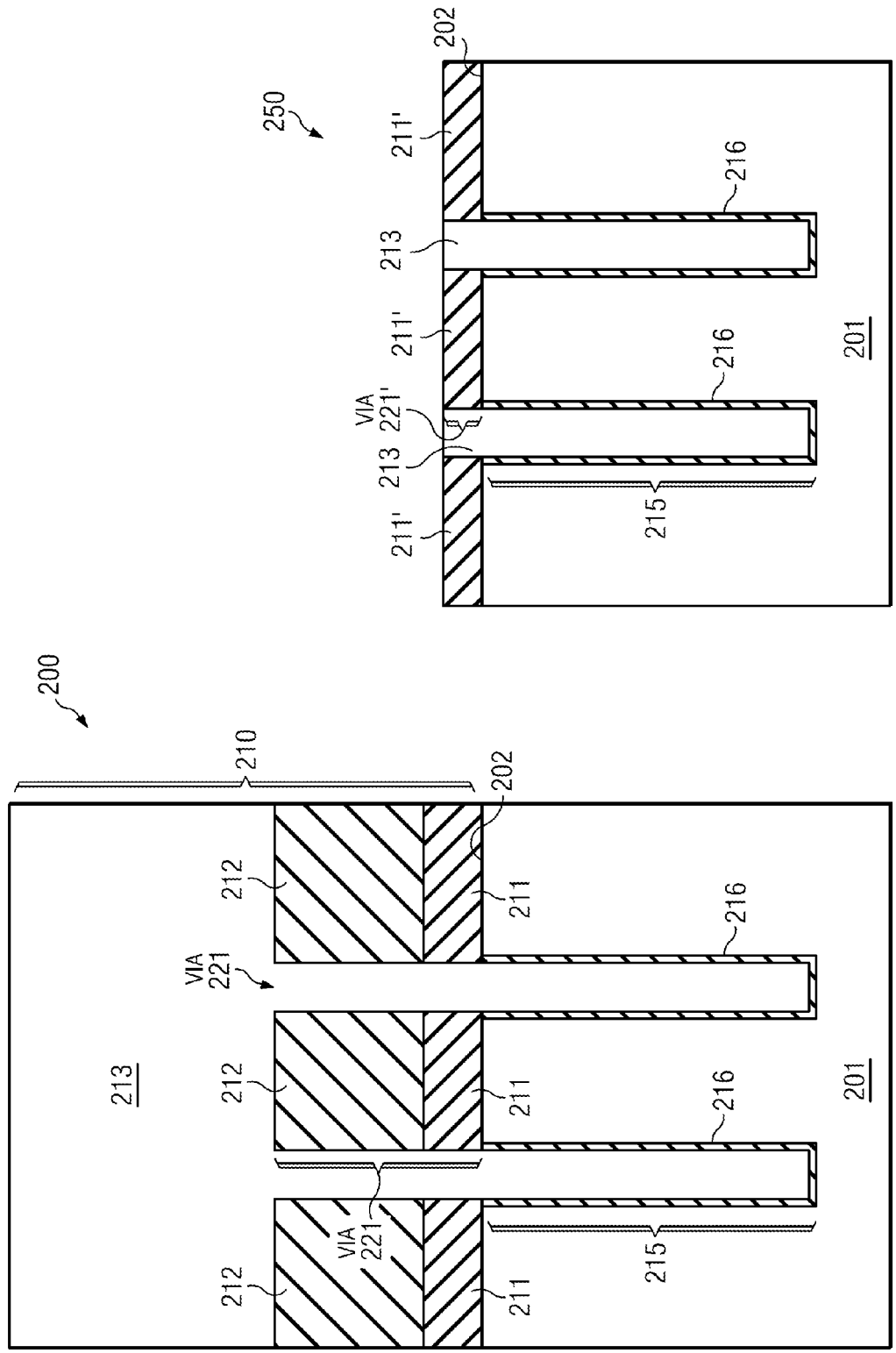

SINGLE STEP CMP FOR POLISHING THREE OR MORE LAYER FILM STACKS

FIELD

Disclosed embodiments relate to chemical mechanical polishing (CMP) for semiconductor integrated circuit manufacturing and, more particularly, to CMP processes for polishing multi-layer stacks that include a top polysilicon layer.

BACKGROUND

In general CMP involves the concurrent chemical and mechanical polishing of an overlying first layer to expose the surface of a non-planar second layer on which the first layer is formed. Briefly, a CMP process generally uses a polymeric polishing pad and a slurry that includes chemicals and abrasive particles to remove a first layer at a faster rate than a second layer until the surface of the overlying first layer of material becomes coplanar with the upper surface of the covered second layer. The abrasive particles are typically oxides of silicon, aluminum, zirconium or carbides or nitrides of silicon. The slurry chemicals typically include surfactants, oxidants and pH control additives. For planarization of a three layer film stack, due to selectivity considerations, at least two different CMP processes are generally used in conjunction with a separate chemical etch process. Typically, the two different CMP processes are carried out on separated platens, and even separate CMP systems because different chemistries, and therefore different slurry compositions, are needed to polish each layer. For example, in the case of a two layer silicon oxide/silicon nitride film stack, for removing excess silicon oxide, the CMP chemistry typically has a low oxide/nitride selectivity, while the chemistry used for controlled removal of a portion of the nitride has a reduced rate of nitride removal. As compared to a hypothetical single step process, such multi-step processing adds to cycle time, adds to fabrication cost, and can increase defect density. What is needed is a CMP processes that can reduce the number steps involved in CMP processing of a three or more layer film stack.

SUMMARY

The Inventors have identified CMP processes that can polish a three layer film stack with a single CMP step to provide a planarized surface, as opposed to conventional processing that requires two CMP steps and a chemical etch step to polish three layer film stacks. For example, disclosed embodiments can achieve planarized poly-filled trenches by a one-step CMP process which removes a polysilicon film over a silicon oxide film, the silicon oxide film, and a portion of a SiNx film to end on the SiNx film with a resulting controllable SiNx thickness. As used herein, a ""single step CMP process"" refers to a CMP process that uses substantially the same polishing conditions throughout, whether it was conducted on a single platen or over multiple platens. The ""substantially the same polishing conditions"" means the same setpoints for the slurry components, pad rotation speed, head rotation speed, slurry flow rate, polish head downforce, pad conditioner downforce, etc. during steady state polishing operations of the CMP process.

Optical endpoint detection can be use to provide the controlled SiN thickness. Disclosed embodiments can thus overcome the problem of achieving planarized deep trench polysilicon and a uniformly clean semiconductor (e.g., silicon) substrate surface suitable for further processing of shallow trench isolations in trench isolation technology including deep trench isolation technology.

A slurry comprising silica and/or ceria particles have been found to allow single step CMP processing for a polysilicon/silicon oxide/$SiN_x$ stack to provide a removal rate (RR) for the polysilicon layer>a RR for the silicon oxide layer>a RR for the SiNx layer. With progressively lower RRs for the layers in the film stack, clearing of the individual films is facilitated and planarization is achieved.

BRIEF DESCRIPTION OF THE DRAWINGS

FIGS. 2A and 2B are cross sectional views before and after an exemplary single step CMP process for polishing a polysilicon/silicon oxide/SiN film stack for a deep polysilicon filled trench process, according to a disclosed embodiment.

DETAILED DESCRIPTION

Figure 1:
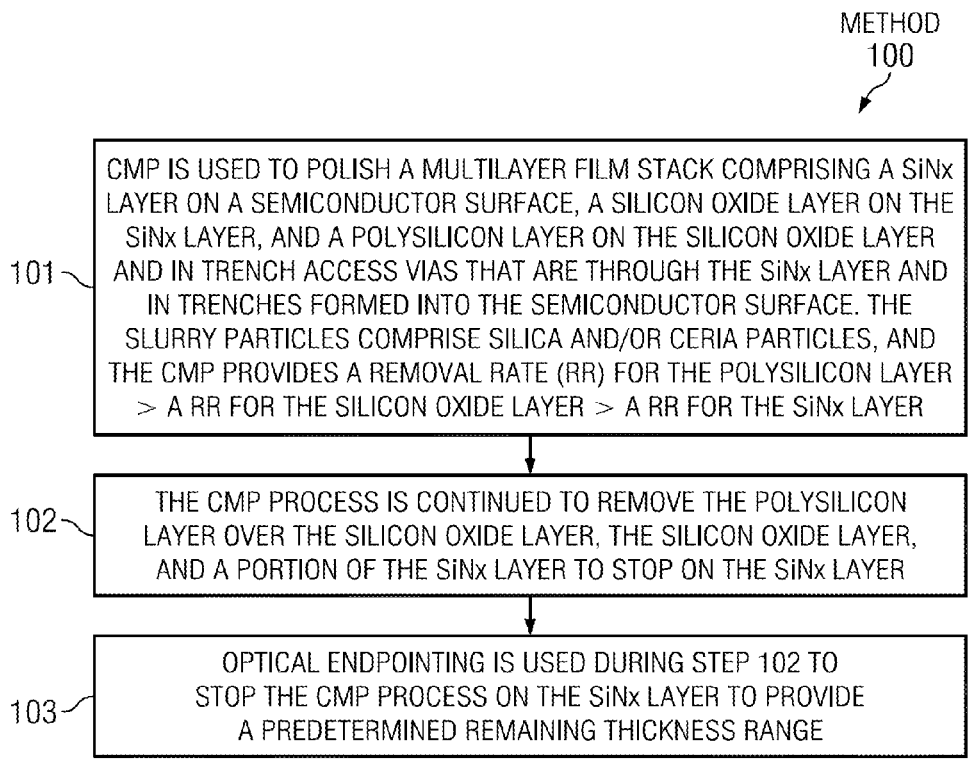
FIG. 1 shows an exemplary method for a one-step CMP process for polishing three or more layer film stacks on a wafer, according to a disclosed embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of ""less than 10"" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 shows an exemplary method 100 for a single step CMP process for polishing three or more layer film stacks on a wafer, according to a disclosed embodiment. The wafer has a semiconductor surface including a multilayer film stack thereon generally comprising a SiNx layer on the semiconductor surface, and a silicon oxide layer on the SiNx layer, wherein trench access vias extend through the SiNx layer to trenches formed into the semiconductor surface. A polysili-"

con layer that fills the trench access vias and trenches is on the silicon oxide layer. As defined herein, a "SiNx layer" refers to pure silicon nitride, as well as silicon nitride comprising mixtures including up to 15 atomic % oxygen, along with some possible atomic % silicon in the form of embedded polysilicon.

The silicon oxide layer is generally deposited silicon oxide layer. The deposited silicon oxide layer can be an undoped layer, or a doped layer such as PSG or BPSG.

In step 101, CMP is used to polish the multilayer film stack with a slurry including slurry particles comprising silica particles, ceria particles or mixtures thereof. The slurry generally comprises from 10 to 40% by weight of slurry particles. In certain embodiments, the slurry particles are irregularly shaped and generally cluster together to form secondary particles that are in a mean size range of about 100 to 200 nm.

As known in the art, the slurry chemicals can include various additives. The additives generally include a pH adjusting agent, an optionally a dispersion stabilizer, an oxidizing agent, a chelating agent, a preservative, and the like. The pH of the slurry is generally from 10.2 to 11.8, such as from 10.5 to 11.5. The pH adjusting agent includes basic substances such as an aqueous ammonia, potassium hydroxide, sodium hydroxide and water-soluble organic amines. The dispersion stabilizer includes surfactants such as anionic surfactants, cationic surfactants and nonionic surfactants, polymeric dispersants such as polyacrylic acids or salts thereof, acrylate copolymers and ethylene oxide/propylene oxide block copolymers (Pluronics), and the like.

The oxidizing agent includes peroxides, permanganic acid or salts thereof, chromic acid or salts thereof, nitric acid or salts thereof, peroxo acid or salts thereof, oxyacid or salts thereof, metal salts, sulfuric acid, and the like.

The chelating agent can include polycarboxylic acids such as oxalic acid, succinic acid, phthalic acid and trimellitic acid; hydroxycarboxylic acids such as glycolic acid, malic acid, citric acid and salicylic acid; polyaminocarboxylic acids such as nitrilotriacetic acid and ethylenediaminetetraacetic acid; phosphonic acids such as aminotri(methylenephosphonic acid) and 1-hydroxyethylidene-1,1-diphosphon-ic acid, and the like.

The preservative can include benzalkonium chloride, benzethonium chloride, 1,2-benzisothiazolin-3-one, and the like. Typical CMP parameter values include a platen RPM=83, a head RPM=100, a head pressure=7 psi, and a slurry flow rate=90 ml/min. It is noted that there is generally a large amount of flexibility in these parameter settings that will generally provide good polishing results.

The CMP provides a RR for the polysilicon layer>a RR for the silicon oxide layer>a RR for the SiNx layer. As noted above, in one specific embodiment the slurry particles comprise ceria and or silica particles. Exemplary particles include silicon oxide particles such as colloidal silica particles, fumed silica particles and surface-modified silica particles; and cerium oxide particles such as those having an oxidation number of 3 or 4 and those having hexagonal, isometric or face-centered cubic crystal system, and the like. The colloidal silica particles generally have a relatively spherical shape, which can be stably dispersed in the state of primary particles, so that aggregated particles are hardly formed, whereby scratches on a surface to be polished can be reduced. The colloidal silica particles can be prepared by a sodium silicate method using an alkali metal silicate such as sodium silicate as a raw material, or an alkoxysilane method using tetraethoxysilane or the like as a raw material. These abrasive particles may be used alone or in admixture of two or more kinds.

A fumed silica slurry has been found by the Inventors to have a natural selectivity between the three films. The RR for polysilicon in fumed silica is approximately 2× the rate of silicon oxide. The RR of silicon oxide in fumed silica is approximately 2.5× higher than SiNx.

The abrasive particles may generally be produced by any technique known to those skilled in the art. Such abrasives can be produced using any high temperature process such as sol-gel, hydrothermal or, plasma process, or by processes for manufacturing fumed or precipitated metal oxides. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of silica, ceria or similar oxide, typically referred to as primary particles, fuse with one another by undergoing collisions at their contact points to form branched, three dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

In step 102, the CMP process is continued to remove the polysilicon layer over the silicon oxide layer, the silicon oxide layer, and a portion of the SiNx layer to stop on the SiNx layer. Step 103 comprises optical endpointing during step 102 to stop the CMP process on the SiNx layer to provide a predetermined remaining thickness range. Optical endpointing allows for good accuracy in removing SiNx to achieve a desired target thickness, and accuracy is further improved as the SiNx film has the lowest removal rate of the films in the film stack, thus increasing the process window and minimizing variance in endpoint detection.

One exemplary application for disclosed embodiments is for deep trench isolation. Deep trench isolation is used in a variety of bipolar and bi-CMOS process technologies. This isolation technique utilizes a deep trench etched into a substrate having a semiconductor surface, such as the surface of a bulk silicon substrate, that is lined with thin silicon oxide and then filled with generally undoped polysilicon. The poly filled trench is then capped with field oxide. For the typical application of isolation, the undoped polysilicon fill is left electrically floating by interposing dielectric material between the poly fill and the overlying metal interconnect structure of the integrated circuit.

FIGS. 2A and 2B are cross sectional views of the structure before 200 and structure after 250 single step CPM for polishing a polysilicon/silicon oxide/SiN film stack for a deep polysilicon filled trench process, according to a disclosed embodiment. As shown in FIG. 2A, a substrate wafer 201 having a semiconductor surface 202 (e.g. silicon wafer) includes a multilayer film stack 210 thereon comprising a SiNx layer 211 on the semiconductor surface 202, and a silicon oxide layer 212 on the SiNx layer. Trench access vias 221 extend through the silicon oxide layer 212 and SiNx layer 211 to trenches 215 formed into the semiconductor surface 202. A polysilicon layer 213 fills the trench access vias 221 and trenches 215 is on the silicon oxide layer 212. A dielectric trench liner 216, such as thermally grown silicon oxide, is shown framing the trenches 215. Although not shown, a thin SiNx capping layer (e.g. 5 to 20 nm) can be interposed between the silicon oxide layer 212 and the polysilicon layer 213.

The depth of the trenches 215 is generally 15 μm to 35 μm. A thickness range for the polysilicon layer 213 is generally from 5 k to 14 kA, a thickness range for the silicon oxide layer is generally from 1 k to 6 kA, and a thickness range for the SiNx layer is 500 A to 2.5 kA. The polysilicon layer 213 can be doped or undoped. Doped polysilicon can be provided by an in-situ polysilicon deposition tool.

FIG. 2B is a cross sectional view of the structure after 250 single step CPM for polishing the structure shown in FIG. 2A. The polysilicon layer 213 that was over the silicon oxide layer 212 has been removed as has the silicon oxide layer 212. The silicon nitride layer remaining after CMP is shown as 211' reflecting thickness of the SiNx layer 211 shown in FIG. 2A remaining after CMP. In one embodiment the thickness of silicon nitride layer 211' is from 500 Angstoms (A) to 2,500 A. Optical endpointing as disclosed herein can provide a range about a predetermined thickness target of about ±10%, or about ±120 A for a 1200 A target. The remaining portion of the trench access vias 221 are now shown as 221'.

The active circuitry formed on the top semiconductor surface comprises circuit elements that generally include transistors, diodes, capacitors, and resistors, as well as signal lines and other electrical conductors that interconnect these various circuit elements.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

EXAMPLES

Disclosed embodiments are further illustrated by the following specific Examples, which should not be construed as limiting the scope or content of this Disclosure in any way.

Figure 3:
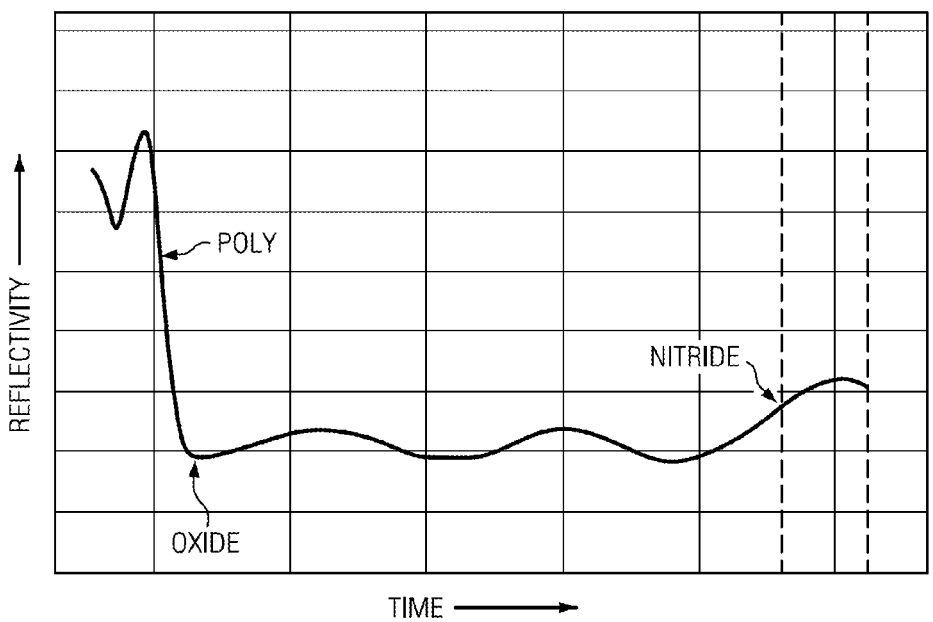
FIG. 3 shows an endpoint trace during exemplary one-step CMP processing of a polysilicon/silicon oxide/SiN film stack, according to a disclosed embodiment.

FIG. 3 shows an endpoint trace measuring the reflectivity of the wafer as it is being processed during exemplary single step CMP processing of a polysilicon/silicon oxide/SiNx film stack. The layer thicknesses comprised polysilicon=10 kA, silicon oxide=3.4 kA and SiNx=1.96 kA. The post CMP nitride thickness was about 1.5 kA. The CMP parameters included platen RPM=83, a head RPM=100, head pressure=7 psi, and slurry flow rate=90 ml/min. The slurry used was Fujimi PL4217 slurry (Fujimi Corporation, Tualatin, Oreg. 97062) having 25% by weight solids fumed silica. Fujimi's PL4217 has three main components fumed silica, KOH, and DI water. Fumed primary particles generally cluster together to form secondary particles with a mean size of about 130 to 150 nm. Primary particles are irregularly shaped which helps them to combine to generate secondary particles.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. For example, the approaches described herein can be generally applied to any three (or more) film stack that has a decreasing removal rate (from the top layer of the film stack downward) to provide the selectivity profile described herein. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A single step method for planarization of a wafer having a semiconductor surface including a multilayer film stack thereon comprising a silicon nitride (SiNx) layer on said semiconductor surface, and a silicon oxide layer on said SiNx layer, wherein trench access vias extend through said silicon oxide layer and said SiNx layer to trenches formed into said semiconductor surface, and wherein a polysilicon layer that fills said trench access vias and said trenches is on said silicon oxide layer, comprising:

chemical mechanical polishing (CMP) said multilayer film stack with a slurry including slurry particles comprising at least one of silica particles and ceria particles, wherein said CMP provides a removal rate (RR) for said polysilicon layer is greater than a RR for said silicon oxide layer is greater than a RR for said SiNx layer, and wherein said CMP removes said polysilicon layer, said silicon oxide layer and a portion of said SiNx layer and stops on said SiNx layer.

2. The method of claim 1, further comprising optical endpointing to stop said CMP on said SiNx layer.

3. The method of claim 1, wherein said silicon oxide layer is a deposited silicon oxide layer.

4. The method of claim 3, wherein said deposited silicon oxide layer comprises an undoped silicon oxide layer.

5. The method of claim 3, wherein said deposited silicon oxide layer comprises a doped silicon oxide layer.

6. The method of claim 1, wherein said silica particles comprise fumed silica or colloidal silica.

7. The method of claim 1, wherein a pH of said slurry is from 10.2 to 11.8.

8. The method of claim 1, wherein said semiconductor surface comprises silicon.

9. The method of claim 1, wherein said silica particles comprise fumed silica and said RR rate for said polysilicon layer is greater than 1.5× said RR for said silicon oxide layer, and wherein RR for said silicon oxide layer is greater than 2× said RR for said SiNx layer.

10. The method of claim 1, wherein said polysilicon layer comprises a doped polysilicon layer.

11. The method of claim 1, wherein said slurry comprises from 10 to 40% by weight of said slurry particles.

12. The method of claim 1, wherein said slurry particles cluster together to form secondary particles that are in a mean size range of about 100 to 200 nm.

13. The method of claim 1, wherein a thickness range for said polysilicon layer is from 5 k to 14 kÅ, a thickness range for said silicon oxide layer is from 1 to 6 kÅ, and a thickness range for said SiNx layer is from 500 Å to 2.5 kÅ.

14. A single step method for planarization of a wafer having a silicon surface including a multilayer film stack thereon comprising a silicon nitride (SiNx) layer on said silicon surface, and a silicon oxide layer on said SiNx layer, wherein trench access vias extend through said silicon oxide layer and said SiNx layer to trenches formed into said silicon surface, and wherein a polysilicon layer that fills said trench access vias and said trenches is on said silicon oxide layer, comprising:

chemical mechanical polishing (CMP) said multilayer film stack with a slurry including slurry particles comprising at least one of silica particles and ceria particles, wherein said CMP provides a removal rate (RR) for said polysilicon layer is greater than a RR for said silicon oxide layer is greater than a RR for said SiNx layer, and wherein said CMP removes said polysilicon layer, said silicon oxide layer and a portion of said SiNx layer and stops on said SiNx layer, and wherein optical endpointing is used to stop on said SiNx layer.

15. The method of claim 14, wherein said silica particles comprise fumed silica or colloidal silica.

16. The method of claim 15, wherein said RR rate for said polysilicon layer is greater than 1.5× said RR for said silicon oxide layer, and wherein said RR for said silicon oxide layer is greater than 2× said RR for said SiNx layer.

* * * * *